United States Patent [19]

Mitama

[11] Patent Number: 5,740,527
[45] Date of Patent: Apr. 14, 1998

[54] TRANSCEIVER

[75] Inventor: Masataka Mitama, Tokyo, Japan

[73] Assignee: NEC Corporation, Japan

[21] Appl. No.: 561,984

[22] Filed: Nov. 22, 1995

[30] Foreign Application Priority Data

Nov. 24, 1994 [JP] Japan ................... 6-314012

[51] Int. Cl.$^6$ ................... H04B 1/10; H05K 9/00
[52] U.S. Cl. ................... 455/301; 361/818
[58] Field of Search ................... 455/300, 301, 455/89, 90; 361/816, 818, 789, 800

[56] References Cited

U.S. PATENT DOCUMENTS

| | | | |
|---|---|---|---|
| 4,658,334 | 4/1987 | McSparran et al. | 361/818 |
| 4,791,527 | 12/1988 | Brown | 361/816 |
| 5,438,482 | 8/1995 | Nakamura et al. | 361/816 |
| 5,519,578 | 5/1996 | Fujii | 361/818 |
| 5,525,953 | 6/1996 | Okada et al. | 361/789 |

FOREIGN PATENT DOCUMENTS

| | | |
|---|---|---|
| 2-279027 | 11/1990 | Japan . |
| 5-102635 | 4/1993 | Japan . |
| 2279180 | 6/1994 | United Kingdom . |

Primary Examiner—Amelia Au
Attorney, Agent, or Firm—Ostrolenk, Faber, Gerb & Soffen, LLP

[57] ABSTRACT

The invention provides a transceiver in which a mutual interference between the transmitting and receiving circuits can be suppressed, without a shielding plate therebetween. The transceiver comprises the first and second printed circuit boards, which are positioned face to face. Components of the transceiver are mounted on the front surfaces of the aforementioned printed circuit boards, and compose the transmitting and receiving circuits. The front surfaces of the first and second boards are respectively divided into the transmitting and receiving regions As and Bs, on which corresponding components are respectively mounted. The aforementioned regions As and Bs are so formed that they are respectively positioned face to face, then the components of the transmitting and receiving circuits are never positioned back to back, and the mutual interferences between the transmitting and receiving circuits does not occurs, even if a shielding plate is eliminated.

11 Claims, 6 Drawing Sheets

TRANSCEIVER

FIELD OF THE INVENTION

The invention relates to a transceiver, in which transmitting and receiving circuits are implemented on printed circuit boards and contained in the same casing, and especially to an interference-free transceiver; in which qualities of communications are not deteriorated by interferences between the transmitting and receiving circuits in a limited space.

BACKGROUND OF THE INVENTION

In a transceiver, which contains a transmitting circuit and a receiving circuit in a common casing, there is an afraid of mutual interference between the aforementioned circuits, which may cause noises and instabilities of operations. Then, it is very important that the arrangement of circuit components is so designed as to decrease the electro-magnetic coupling between the transmitting and receiving circuits.

On the other hand, the transceiver must meet increasing requirements of small-sizing and light-weight of itself. It is easy to decrease the electro-magnetic coupling between the transmitting and receiving circuits, if the both circuits are sufficiently remote from each other, but this way cannot be adopted on account of the requirements of small-sizing and etc.

Then, engineers of the transceiver must solve incompatible problems, and considerable efforts have been made to overcome these difficulties. One of effective methods hitherto proposed is that a metallic shielding plate is inserted between the transmitting and receiving circuits. However, the shape of the metallic shielding plate becomes too complicated, and is hard to manufacture, and further improvements are extremely desirable.

SUMMARY OF THE INVENTION

Accordingly, it is an object of the invention to provide a transceiver, in which the mutual interference between the transmitting and receiving circuits can be suppressed without using the shielding plate with a complicated structure, and the difficulties related to designing and manufacturing of the shielding plate can be eliminated.

According to the invention, a transceiver having first and second circuit boards positioned face to face, and transmitting and receiving circuits composed by components and mounted on front surfaces of the first and second circuit boards, comprises:

transmitting and receiving regions, which are obtained by dividing front surfaces of the first and second printed circuit boards, and respectively have transmitting and receiving circuits thereon, wherein the transmitting and receiving regions on the first printed circuit board and those of the second printed circuit board are positioned face to face, and coupling means, which electrically and mechanically couples said first and second printed circuit boards.

BRIEF DESCRIPTION OF THE DRAWINGS

The invention will be explained in more detail in conjunction with the appended drawings, wherein.

DESCRIPTION OF THE PREFERRED EMBODIMENTS

Before explaining a transceiver in the preferred embodiment according to the invention, the aforementioned conventional transceiver will be explained in FIGS. 1 to 3.

In a wireless transmitting and receiving apparatus, such as a handy transceiver, transmitting and receiving circuits are generally approximate to each other. For example, FIG. 1 shows a circuit diagram of a conventional transceiver with a function of diversity receiving. The conventional transceiver with diversity receiving capability comprises two receiving circuit 20A and 20B, and a transmitting circuit 10 as shown in FIG. 1.

In the receiving circuit 20B, a signal received via an antenna terminal 31B is supplied to a high frequency region 21A of a receiving circuit 20B, a first frequency converter, an intermediate frequency amplifier, a second frequency converter and a demodulator, and supplied to a receiver via an audio frequency region 22 and an output terminal 33.

On the other hand, an audio signal generated by a transmitter is supplied to an audio frequency region 12 of a transmitting circuit 10 via na input terminal 32, led to a high frequency converter and a high frequency amplifier and etc., supplied to a transmit-receiver antenna terminal 31A and radiated by an antenna. The receiving circuit 20A and the transmitting circuit 10 are exchanged by a duplexer 30. Two output signals of the receiving circuits 20A and 20B are selected by a branch changeover switch 34 in accordance with qualities of them.

Figure 2:
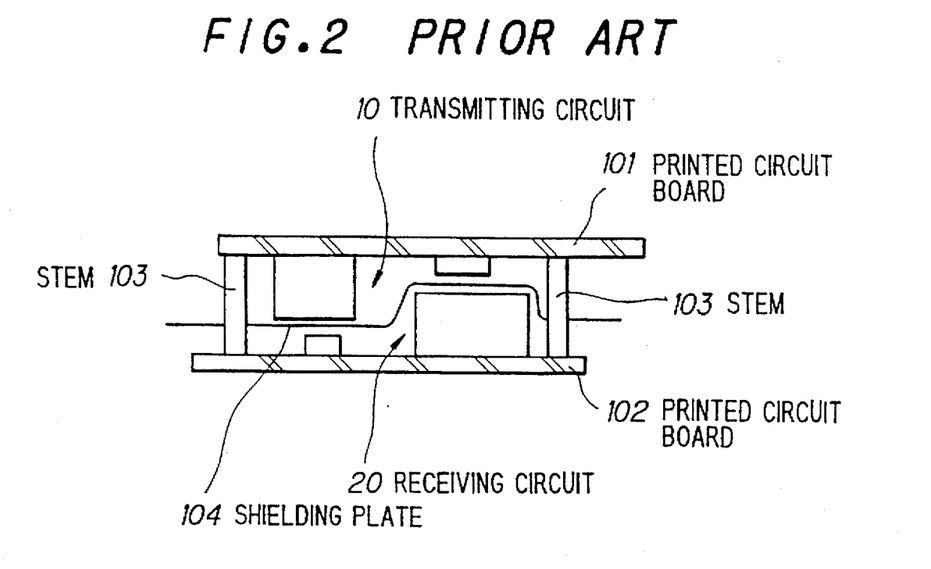
FIG. 2 is a cross-sectional view shown as an example of a structure of a conventional transceiver.

FIG. 2 shows the transmitting and receiving circuits of a conventional transceivers mounted on printed circuit boards, which is shown in Japanese Patent Kokai No.5-102635. Reference numerals 101 and 102 mean printed circuit boards, where the transmitting circuit 10 is mounted on the printed circuit board 101 and the receiving circuit 20 is mounted on the printed circuit board 102. In order to contain the aforementioned printed circuit boards 101 and 102 in a small casing of the transceiver, they are combined back to back with each other using stems 103S, and supported as one body. Moreover, in order to suppress the mutual interference between the transmitting circuit 10 and the receiving circuit 20 caused by electro-magnetic coupling, a shielding plate 104, which is obtained by bending a metallic plate, is inserted between them and connected to the ground, and thereby these circuits are shielded from each other.

Figure 3:
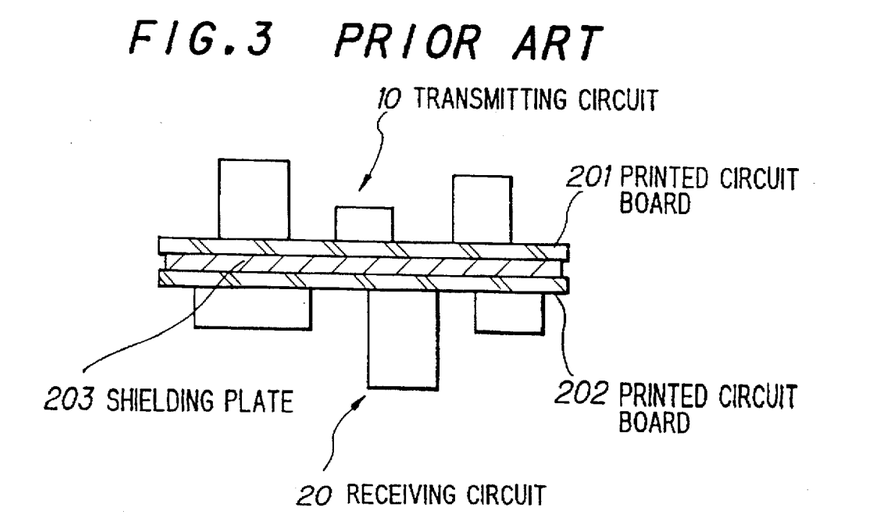
FIG. 3 is a cross-sectional view which shows another example of a structure of a conventional transceiver.

In the structure proposed by the present applicant and shown on Japanese Patent Kokai No. 2-279027, which is shown FIG. 3, the front surfaces of printed circuit boards 201 and 202, on which the transmitting circuit 10 and the receiving circuits 20 are respectively mounted, are combined back to back, a shielding plate 203 is inserted between them, and thereby the mutual interference between them is suppressed.

In the conventional transceiver, such as one shown in FIG. 2, when the transmitting circuit and receiving circuits are composed of tall and short components, the shielding plate 104 must be so bent as not to contact with the components of the both circuits as shown in this drawing, and then it is inevitable that the form of the shielding plate 104 becomes complicated, so that designing and manufacturing of this parts becomes difficult and complicated. If a distance between the printed circuit boards 100 and 102 is made to be sufficiently large, and useless spaces arises near the short components, and it is undesirable from the view point of small-sizing of the transceivers.

In the structure shown in FIG. 3, the dimension of the casing is determined by the heights of the tallest components of the transmitting and receiving circuits, and then it is a obstacle against the recent tendency to small-sizing of the transceiver.

Figure 4:
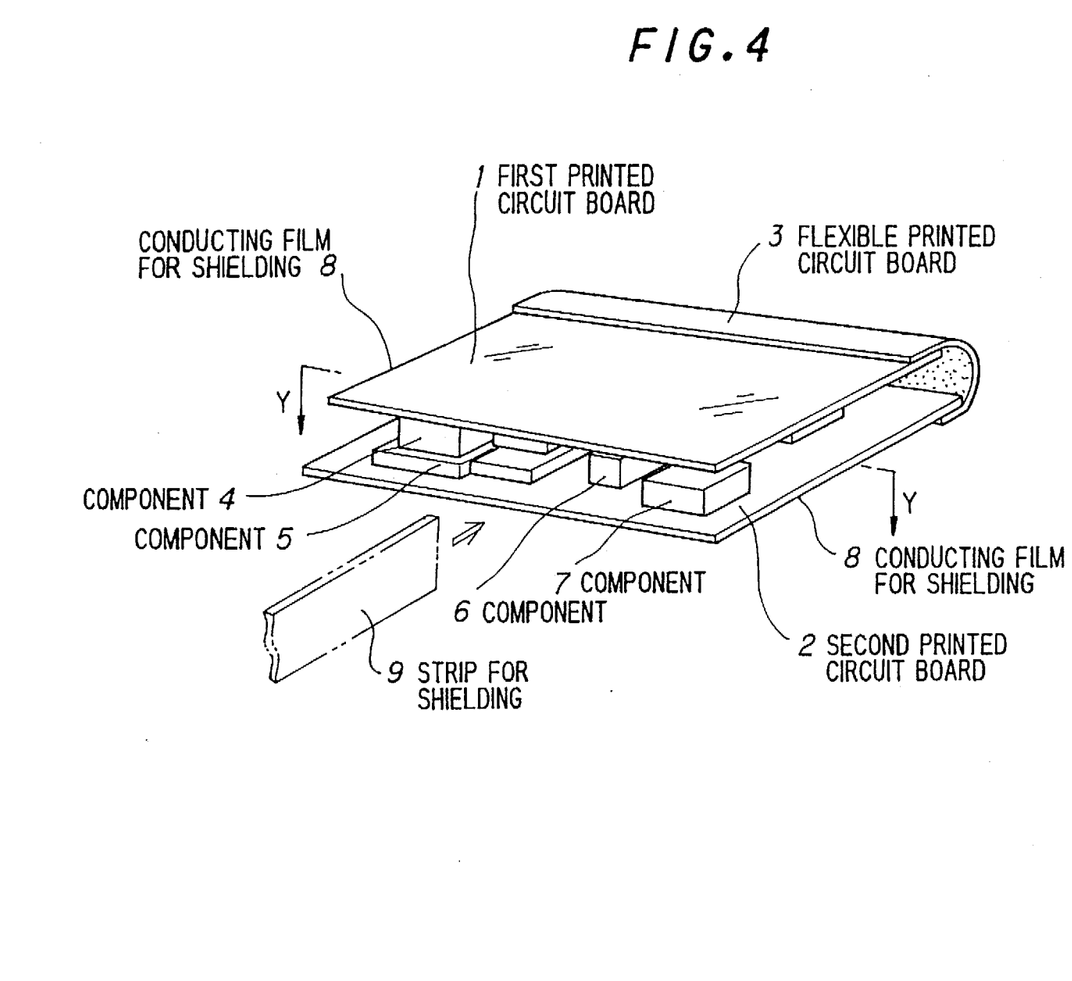
FIG. 4 is a perspective view showing a first preferred embodiment of the invention.
Figure 5:
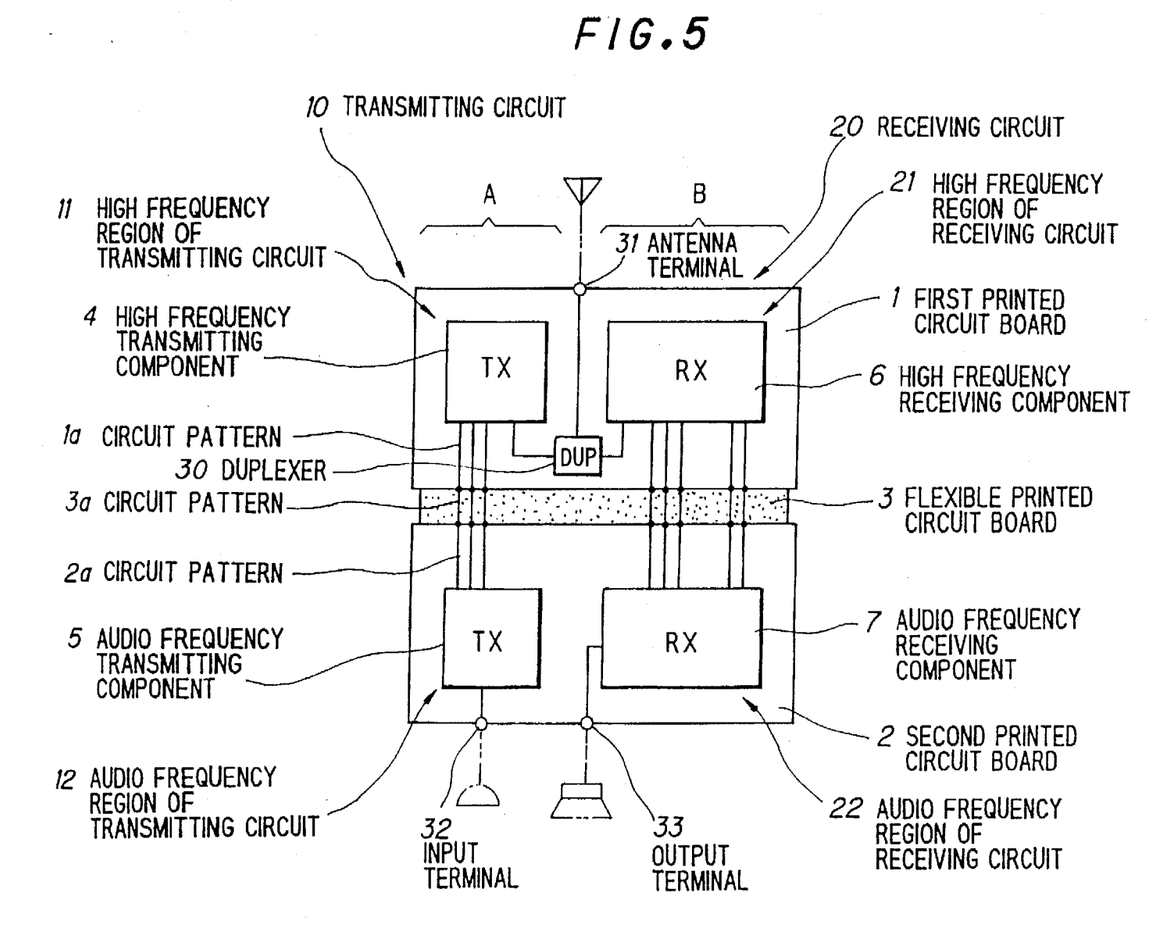
FIG. 5 shows an expanded view of a first preferred embodiment of the invention shown in FIG. 4.

Next, preferred embodiments of the invention will be explained referring to the appended drawings. FIG. 4 is the perspective view of an assembled transceiver as the first preferred embodiment of the invention, and FIG. 5 shows an expanded planer view of the aforementioned transceiver. In those cases, the invention is applied to the transceiver, which comprises a transmitting circuit and a receiving circuit. The internal circuit structure of the transceiver according to the invention is nearly the same as that shown in FIG. 1. The dimension of the first and second printed circuit boards 1 and 2 are nearly the same, and the both printed circuit boards 1 and 2 are connected electrically and mechanically as one body by flexible printed circuit board 3, at side-ends of the both printed circuit boards. By bending the flexible printed circuit board into U-shape, the both printed circuit boards 1 and 2 are positioned face to face with the predetermined dimension.

As shown in FIG. 5, the first and second printed circuit boards, which are coupled by the flexible printed circuit board 3, are respectively divided into two regions A and B in a direction, which is perpendicular to the longitudinal direction of the flexible printed circuit board 3, where the transmitting circuit 10 is mounted on the left-side region A and the receiving circuit 20 on the right-side region B. That is to say, in the transmitting circuit 10, a high frequency transmitting component 4, which composes a high frequency region 11, is mounted on the first printed circuit board 1, and an audio frequency region 12, is mounted on the second printed circuit board 2. Similarly, also in the receiving circuit 20, a high frequency receiving component 6, which composes a high frequency region 21 is mounted on the first printed circuit board 1, and an audio frequency receiving component 7 is mounted on the second printed circuit board 2. The high frequency regions 11 and 21, and the audio frequency regions 12 and 22, are electrically connected by circuit patterns 1a and 2a, which are respectively formed on the printed circuit boards 1 and 2, and a circuit pattern 3a formed on the flexible printed circuit board 3. Moreover, the transmitting circuit 10 and the receiving circuit 20 are connected to an antenna terminal 31 via a duplexer 30.

Figure 6:
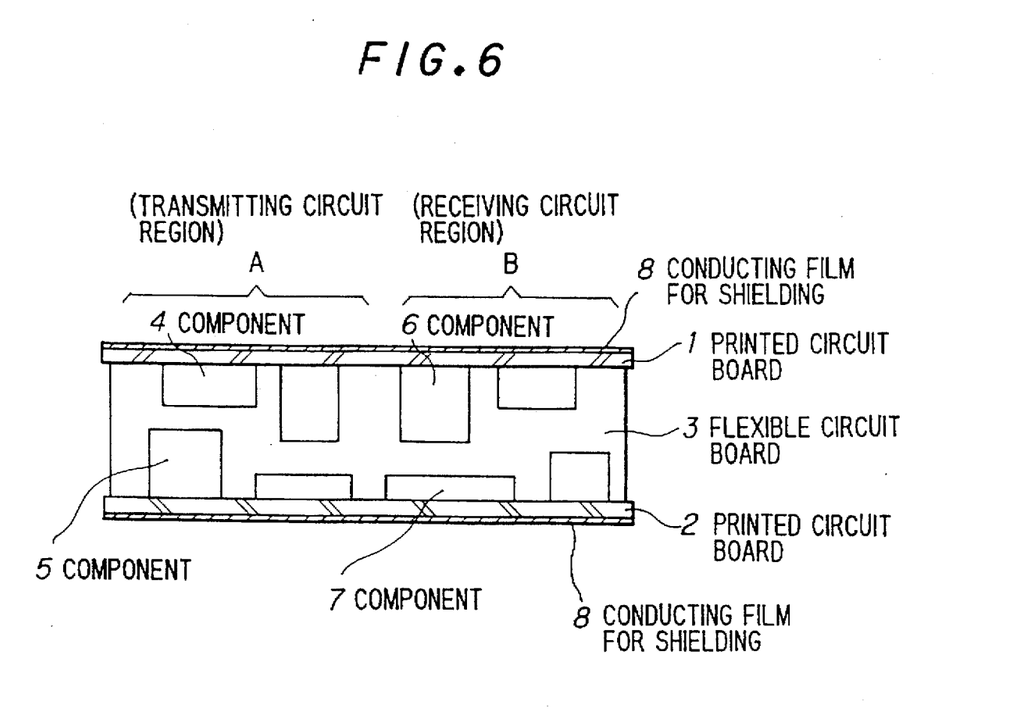
FIG. 6 is a cross-sectional view of the structure shown in FIG. 4 in Y—Y cross-section.

The components 4 to 7 on the transmitting and receiving circuits are mounted on the front sides of the printed circuit boards, and the whole surfaces of the rear sides of them are covered by a conductive film 8 for shielding. By bending the flexible printed circuit board 3 into U-shape, the printed circuit boards 1 and 2 are closed, keeping the front surfaces of them turning inside. As shown in FIG. 6, which is the cross-sectional view in Y—Y cross-section of the structure shown in FIG. 4, the components 4 and 6, both of which are the high frequency components, and the component 5 and 7, both of which are the audio frequency components, are positioned back to back in the both transmitting and receiving circuits 10 and 20, where the arrangement of the components 4 to 7 on the two printed circuit boards 1 and 2 should be so designed that, tall and short components are positioned back to back.

Accordingly, in the structure according to the invention, even when components 4 to 7 mounted on the printed circuit boards 1 and 2 are positioned back to back, both approximate components belong to the transmitting circuit 10 or the receiving circuit 20. In other words, the components of the transmitting circuit 10 are never approximate to the those of the receiving circuit 20, and the components of the receiving circuit 20 are never approximate to those of the transmitting circuit 10. Then the mutual interference between the transmitting and receiving circuits 10 and 20 can be suppressed without a shielding plate, and the deteriorations of the qualities of the communication can be prevented.

As mentioned in the above, since arrangement of each component is so designed that the tall and short components are positioned back to back, the space between the first and second printed circuit boards 1 and 2 can be narrowed and effectively used. Then, the components can be implemented with high density, and this feature is profitable for thinning and small-sizing of the transceiver.

Moreover, in the embodiment, since the rear surface of the each printed circuit board is covered with the conductive film 8 for shielding, the components 4 to 7 are shielded from external electro-magnetic interference, when the both front surfaces of the printed circuit boards are positioned face to face.

Still more, in order to more effectively prevent the mutual interference between the transmitting and receiving circuits 20 and 10, it is suitable to insert a strip for shielding 9 between the regions A and B, which are contained in a space bounded by the first and second printed circuit boards 1 and 2, as shown by an arrow in FIG. 4, and to fix the strip for shielding 9 to the printed circuit boards 1 and 2 by a proper means. In this case, since the strip for shielding 9 can be manufactured as a flat metallic plate with predetermined dimensions, it is very easy to manufacture this element.

Furthermore, in the aforementioned structure of the transceiver, if the components are mounted in such a situation that the first and second printed circuit boards are coupled by the flexible printed circuit board and expanded on a plane, the all components can be mounted in one step of the manufacturing process, a cost of which is nearly the same as that in a case where the components are mounted on a single printed circuit board, and this step can be easily automated.

On the other hand, if the components are mounted on each printed circuit board independently of another one to construct the high and audio frequency regions, the frequency characteristic of the aforementioned regions can be estimated in both high and audio frequency ranges, as soon as the mounting of the components is completed. Accordingly, if only the good printed circuit boards with the components on are selected from the ones produced by the aforementioned process, coupled by the flexible printed circuit boards, and bent into V-shape, the probability of occurrence of the non good product is very small, and the yield rate of the transceiver becomes high.

Figure 1:
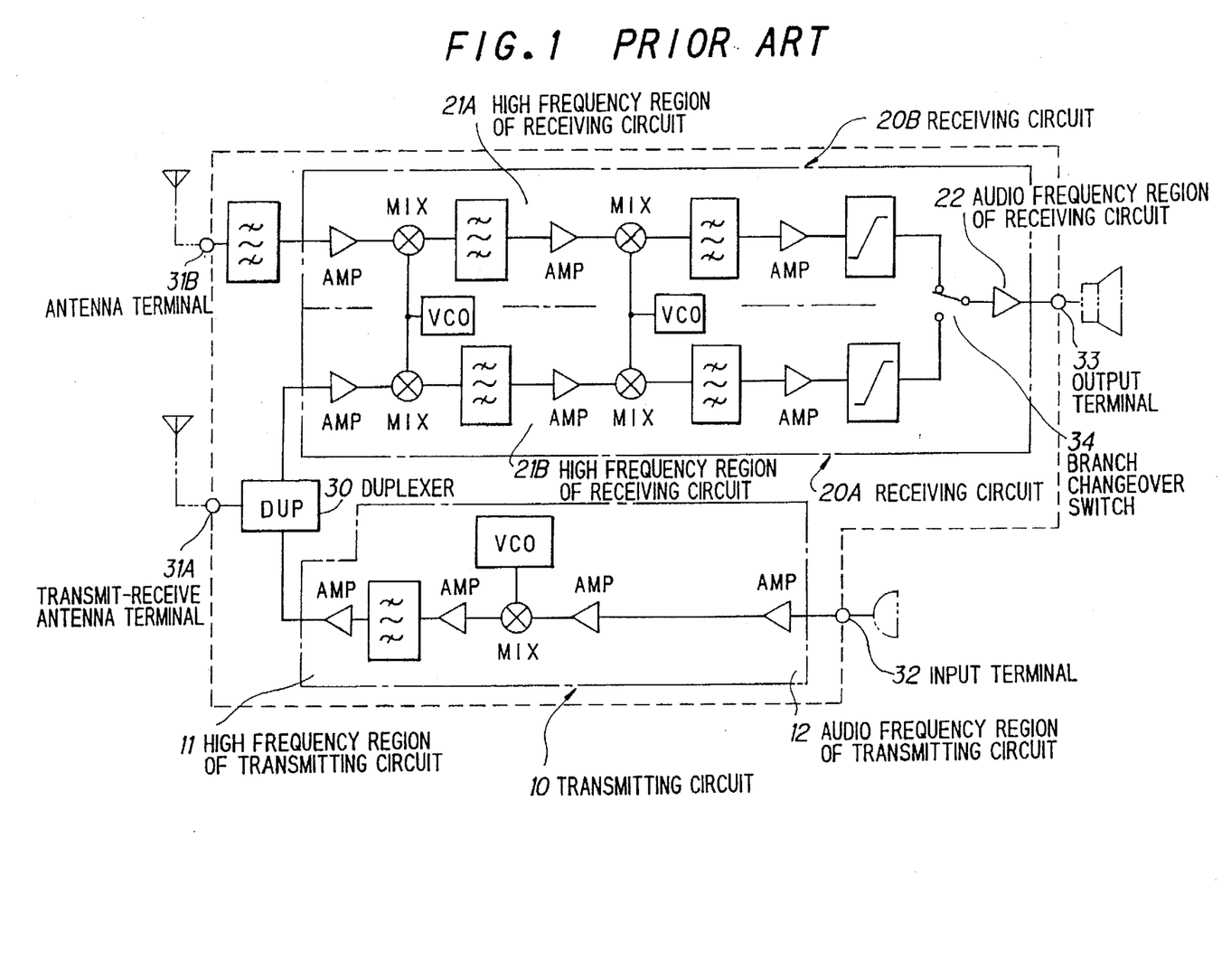
FIG. 1 is a circuit diagram of an example of conventional transceiver.
Figure 7:
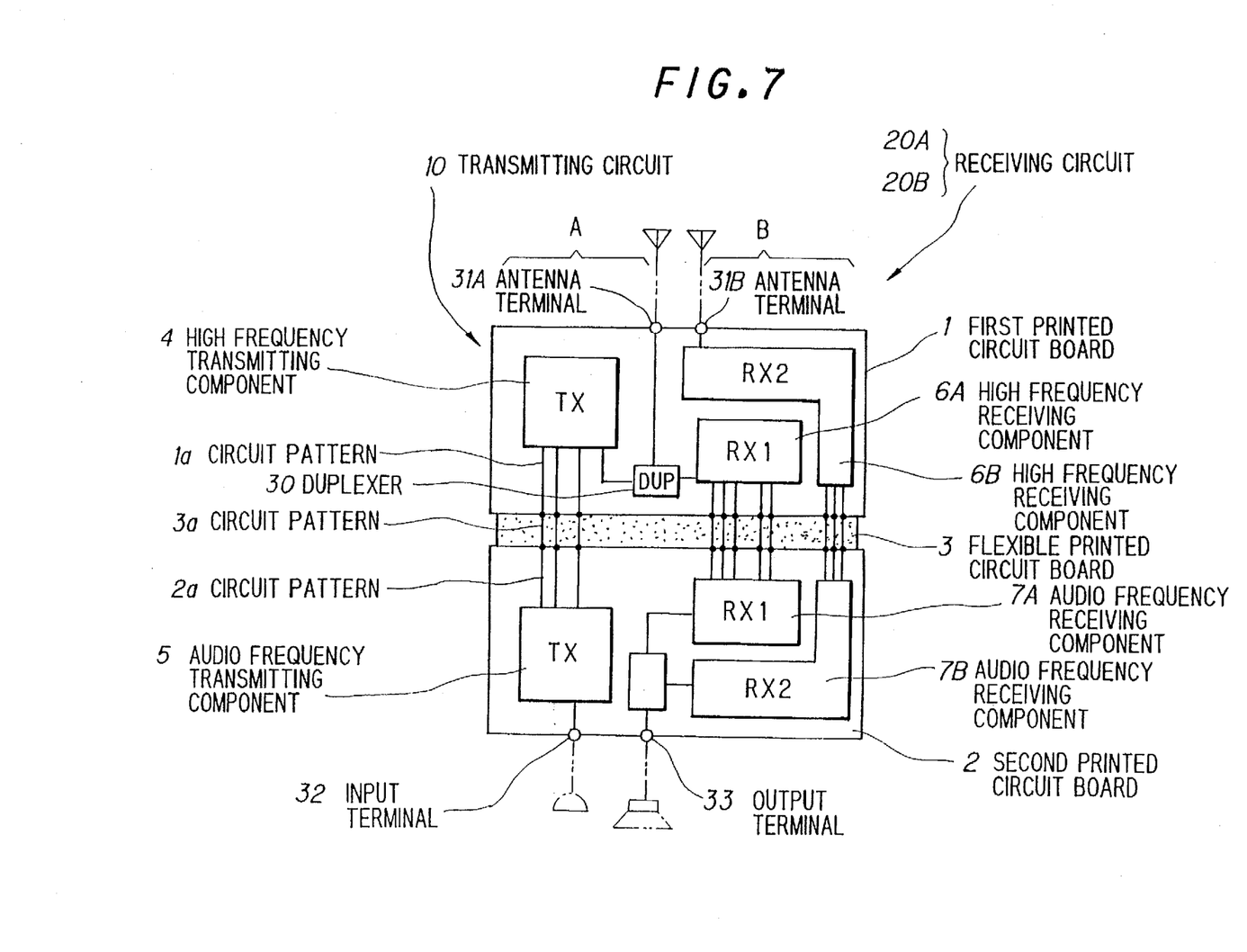
FIG. 7 is an expanded view of the printed circuit board shown as the second preferred embodiment.

FIG. 7 shows the second preferred embodiment of the invention, and a state that the first and second printed circuit boards 1 and 2 are expanded, and in this embodiment, the invention is applied to the transceiver with a diversity receiving capability, which is shown in FIG. 1. Since two receiving circuits 20A and 20B are necessary in this embodiment, an area occupied by receiving circuits 20A and 20B on the printed circuit boards 1 and 2 are large as compared with that of transmitting circuit 10. As shown in FIG. 7, on a region B on the first printed circuit board 1, high frequency receiving components 6A and 6B are respectively mounted, and on the region B on the second printed circuit board 2, audio frequency components 7A and 7B are respectively mounted. Where, it should by note that the components 6A and 7A belong to the receiving circuit 20A, and the components 7A and 7B to the receiving circuit 20B.

Moreover, on a transmitting region A of the first and second printed circuit boards 1 and 2, high and audio frequency transmitting components 4 and 5 are respectively mounted. Then, by bending the flexible printed circuit board 3, which couples the first and second printed circuit boards 1 and 2, the components 4, 5, 6A, 6B, 7A and 7B are positioned back to back, where, it should be emphasized that the arrangements of the aforementioned components are so designed that tall and corresponding short components are positioned back to back.

Accordingly, also in the structure shown in FIG. 7, even when the components of the first and second printed circuit boards 1 and 2 are positioned back to back and approximate to each other, the circuit components of the transmitting circuit 10 are never approximate to those of the receiving circuit 20A and 20B. Therefore, a mutual interferences between the transmitting and receiving circuits are sufficiently small and the deterioration of the quality of the communication can be prevented, even if no shielding plate is used between both circuits.

Also in this embodiment, the rear surfaces of the first and second printed circuit boards are covered with conducting films for shielding (not shown), and their front surfaces are arranged face to face. The components 4,5, 6A 6B, 7A and 7B are surrounded by the aforementioned conducting films and shielded from an external space. Moreover, if a strip for shielding are inserted between the front surfaces of the printed circuit boards 1 and 2 and fixed to the printed circuit boards by and appropriate means, the interferences between the transmitting and receiving circuits are more effectively prevented.

Still more, in the above descriptions, examples, in which the high and audio frequency regions of the transmitting and receiving circuits are separately mounted on the first and second printed circuit boards, have been explained. However, in accordance with necessity, a portion of the components for the high or audio frequencies regions may be mounted on another printed circuit boards, or the components for the high and audio frequency regions may be mounted, being mixed together.

As described in the above, the first and second printed circuit boards, which are positioned face to face, are respectively divided into the transmitting and receiving regions, and the components of the transmitting and receiving circuits are mounted on the corresponding regions on the first and second printed circuit boards. Then, the components of the transmitting circuit and those of the receiving circuit are never positioned back to back, and the interference between the transmitting and receiving circuit is prevented without shielding plate between them. Thereby, steps of manufacturing and implementing of the shielding plate can be eliminated, and the manufacturing process can be simplified.

The first and second printed circuit boards are coupled electrically and mechanically by the flexible printed circuit board. However, by expanding the flexible printed circuit into a plane, the first and second printed circuit boards can be regarded as a single plane, and mounting of the components can be carried out similarly to the case of a single printed circuit board, and thereby the manufacturing process becomes more easy.

Moreover, since the components mounted on the first and second circuit boards are so arranged that tall and short components are positioned back to back, when said circuit boards are closed. Then, a narrow space bounded by the front surfaces of said circuit boards can be effectively used, and the transceiver can be thin and small-sized.

Since the all components, which compose the transmitting and receiving circuits, are mounted on the front surfaces of the printed circuit boards, the rear surface of the printed circuit boards are covered with the shielding plates and the printed circuit boards are closed to be positioned face to face, the all components are shielded from the external electro-magnetic interferences.

Still more, if the all components for high frequency regions of the transmitting and receiving circuits are mounted on one of the printed circuit boards, and the all components for the audio frequency region are mounted on another printed circuit board, the inspection of the characteristics of each printed circuit board can be carried out independently, after the each printed circuit board are fabricated independently, and then the yield rate of the products can be improved.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A transceiver having first and second circuit boards positioned face to face, and transmitting and receiving circuits composed by components mounted on front surfaces of said first and second circuit boards, comprising:

transmitting and receiving regions defined by dividing front surfaces of said first and second printed circuit boards, and respectively have transmitting and receiving circuits thereon, said transmitting and receiving regions on said first printed circuit board and those of said second printed circuit board positioned face to face, and coupling means which electrically and mechanically couples said first and second printed circuit boards to each other.

2. A transceiver according to claim 1, wherein:

rear surfaces of said first and second circuit boards are covered with metallic films for electro-magnetic shielding.

3. A transceiver according to claim 2, wherein:

said coupling means is made of a flexible printed circuit, which is bent into a U-shape to position said first and second printed circuit boards face to face.

4. A transceiver according to claim 3, wherein:

said components, which are positioned back to back, are combinations of tall and short components.

5. A transceiver according to claim 4, wherein:

components for a high frequency region are mounted on said first printed circuit board, and components for an audio frequency region are mounted on said second printed circuit board.

6. A transceiver according to claim 4, wherein:

a space, between said front surfaces of said first and second printed circuit boards is separated by a metallic strip for shielding into two sub-spaces which respectively contains said transmitting and receiving circuits.

7. A transceiver comprising:

a first printed circuit board for mounting a high frequency receiving component on a first region of a first surface thereof and a high frequency transmitting component on a second region of said first surface thereof;

a second printed circuit board for mounting an audio frequency receiving component on a first region of a first surface thereof and an audio frequency transmitting component on a second region of said first surface thereof, said first surface of said second printed circuit board being arranged to face said first surface of said first printed circuit board with a predetermine distance providing a space therebetween accommodating said high frequency receiving and transmitting components, and said audio frequency receiving and transmitting components;

a flexible printed circuit board mechanically coupling said first and second printed circuit boards to each other, and electrically coupling said high frequency and audio frequency receiving components and said high frequency and audio frequency transmitting components.

8. A transceiver according to claim 7, wherein:

said high frequency and audio frequency receiving components comprise tall and small sub-components, said tall sub-components being positioned to face said small sub-components between said first and second printed circuit boards;

said high frequency and audio frequency transmitting components comprise tall and small sub-components, said tall sub-components being positioned to face said small sub-components between said first and second printed circuit boards.

9. A transceiver according to claim 7, wherein the first and second regions are divided along the front surfaces of said first and second printed circuit boards along a plane which intersects said flexible printed circuit board.

10. A transceiver according to claim 1, wherein the transmitting and receiving regions are divided along the front surfaces of said first and second printed circuit boards along a plane which intersects said coupling means.

11. A transceiver, having first and second circuit boards positioned face to face, and transmitting and receiving circuits composed by components mounted on front surfaces of said first and second circuit boards, comprising:

transmitting and receiving regions defined by dividing front surfaces of said first and second printed circuit boards, and respectively have transmitting and receiving circuits thereon, said transmitting and receiving regions on said first printed circuit board and those of said second printed circuit board are positioned face to face, and a coupling device which electrically and mechanically couples said first and second printed circuit boards to each other.

\* \* \* \* \*